(12) United States Patent
Deng et al.

(10) Patent No.: US 7,301,849 B2
(45) Date of Patent: Nov. 27, 2007

(54) SYSTEM FOR REDUCING ROW PERIPHERY POWER CONSUMPTION IN MEMORY DEVICES

(75) Inventors: Xiaowei Deng, Plano, TX (US); Theodore W. Houston, Richardson, TX (US); Bryan D. Sheffield, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/618,473

(22) Filed: Jul. 11, 2003

(65) Prior Publication Data

US 2005/0007861 A1    Jan. 13, 2005

(51) Int. Cl.
   *G11C 8/00*    (2006.01)
(52) U.S. Cl. .................... 365/230.06; 365/229
(58) Field of Classification Search ........... 365/230.06, 365/229
   See application file for complete search history.

(56) References Cited

U.S. PATENT DOCUMENTS

| | | | |
|---|---|---|---|
| 4,247,921 A * | 1/1981 | Itoh et al. ............... 365/230.06 |
| 5,596,286 A | 1/1997 | Houston ........................ 326/33 |
| 5,926,433 A * | 7/1999 | McLaury ................ 365/230.06 |
| 5,982,701 A * | 11/1999 | Eto ......................... 365/230.06 |
| 6,580,658 B1 * | 6/2003 | Hsu et al. .............. 365/230.06 |
| 2001/0028581 A1 * | 10/2001 | Yanagisawa et al. .. 365/189.05 |
| 2003/0043680 A1 * | 3/2003 | Akiba et al. ................. 365/227 |
| 2004/0252573 A1 * | 12/2004 | Hanson et al. .............. 365/229 |

OTHER PUBLICATIONS

Koji Nii, et al., "A 90 nm Low Power 32K-Byte Embedded SRAM with Gate Leakage Suppression Circuit for Mobile Applications", Symposium on VLSI Circuits, 2003.

\* cited by examiner

*Primary Examiner*—VanThu Nguyen
(74) *Attorney, Agent, or Firm*—Rose Alyssa Keagy; W. James Brady; Frederick J. Telecky, Jr.

(57) ABSTRACT

The present invention provides a system for reducing row periphery power consumption in a semiconductor memory device, particularly during sleep mode operation. A memory device (100) according to the present invention has a row (106) of memory cells and driver circuitry (102) preceding the row of memory cells. The present invention provides an intervention circuit (114) instantiated within the driver circuitry proximal to the row of memory cells. The intervention circuit is operated to hold the row of memory cells at a desired state, while the driver circuitry (108, 110) preceding the intervention circuit is powered down.

11 Claims, 3 Drawing Sheets

SYSTEM FOR REDUCING ROW PERIPHERY POWER CONSUMPTION IN MEMORY DEVICES

TECHNICAL FIELD OF THE INVENTION

The present invention relates generally to the field of semiconductor devices and, more particularly, to a system for reducing row periphery power consumption in memory devices.

BACKGROUND OF THE INVENTION

Memory systems are known in the art and used in nearly all microprocessor and digital equipment applications. Memory systems generally utilize different types of memory for different applications. One such type of memory is Static. Random Access Memory ("SRAM"). SRAM systems have the advantage of high speed and ease of use as compared to some other types of memory systems. In addition, SRAM systems using MOS technology exhibit extremely low standby power and do not require a refresh cycle to maintain the information stored in the SRAM system. These attributes make SRAM systems particularly desirable for portable equipment, such as laptop computers. As a result, SRAM arrays are becoming an increasingly large portion of many integrated circuits.

In an integrated circuit, SRAM systems are often organized into arrays of memory cells, arranged in rows and columns. Generally, memory cells are set to one of two data states when storing a bit of information. Each memory cell may be referenced by a unique memory address, which includes a row address and a column address. The term "wordline" generally refers to one or more conductors that correspond to a row of memory cells, whereas the term "bitlines" generally refers to a set of conductors that correspond to a column of memory cells. A memory cell typically includes of pair of complementary ports, with each port connected to one of the two bitlines dedicated to that column. Memory devices commonly operate in a read mode and a write mode. When writing to a memory cell, the wordline is activated, thereby activating the entire row in the array of memory cells. A differential voltage is applied to the bitlines between the two complementary input/output ports of the memory cell. The memory cell is latched to a specific logic state with a logic high indicated on one port and a logic low indicated on the other port. When reading from a memory cell, the wordline is activated and the logic states on the bitlines associated with the memory cell is differentially sensed using a sense amplifier. The sense amplifier outputs an amplified signal corresponding to the logic state written to the memory cell.

The easiest way to lower the power consumption of a SRAM memory array is to lower its operational voltages. One common scheme of reducing power consumption is the introduction of a sleep, or power-down, mode in which data is retained. Generally, in sleep mode, data presented in the memory cells is retained in its current state and, to the greatest extent possible, surrounding circuitry is powered down. Depending on the SRAM design, and the particular semiconductor fabrication technology used, the extent to which power down has been possible has varied greatly. Often, circuitry surrounding a given row (i.e., the row-periphery circuitry) cannot be fully, or even partially, powered down. If this row-periphery circuitry is powered down, the stability and integrity of the data stored in a corresponding row is adversely affected.

Furthermore, considerable efforts have been made to reduce the geometry and feature sizes, and thus the operating voltages and power consumption, of almost all semiconductor fabrication technologies. Transistors and other structures fabricated in smaller device technologies generally become more susceptible to leakage current problems. Thus, the movement to smaller device technologies has increased, particularly in SRAM designs, the prevalence and importance of leakage current considerations and problems.

Consider now an SRAM array fabricated in reduced size technology. Minimizing SRAM standby power during sleep mode is critical to many low-power applications (e.g., wireless communications devices). Again, to the greatest extent possible, voltage levels throughout the array are significantly reduced. Logic circuitry is powered off, and array retention voltages are minimized. As a result, leakage currents for most SRAM array circuits in sleep mode are greatly reduced. Where, however, row-periphery circuitry is not, or cannot, be powered down, leakage currents through the row-periphery become, relative to leakage currents of surrounding array circuitry, extremely large. This reduces the power savings realized during sleep mode. Also, since row access directly controls the SRAM access time (read and write), circuitry added to improve row-periphery power down should be optimized to reduce degradation of performance.

As a result, there is a need for a system for reducing power consumption in memory devices, providing a way to power down row-periphery circuitry without negatively impacting performance, or the stability and reliability of data stored in a corresponding row, in an easy, efficient and cost-effective manner.

SUMMARY OF THE INVENTION

The present invention provides a versatile system for reducing row periphery power consumption in memory devices—particularly SRAM devices—in an easy, efficient and cost-effective manner. The present invention provides apparatus and methods for powering 5, down row-periphery circuitry without negatively impacting the stability and reliability of data stored in a corresponding wordline. Specifically, the present invention provides intervention, or keeper, circuitry instantiated on, or in immediate proximity to, a given wordline. Prior to sleep mode, the intervention circuitry is activated, holding that wordline at its non-accessed state. Wordline driver circuitry, and other circuitry preceding the intervention circuitry (hereafter generally referred to as control circuitry), is then safely powered down without impacting the integrity of the row data. The present invention thus provides optimal power savings in sleep mode while overcoming limitations associated with conventional memory designs.

More specifically, the present invention provides a method of reducing power consumption in a semiconductor memory device having a row of memory cells and circuitry for operating the row of memory cells. The method comprises providing an intervention circuit, and instantiating the intervention circuit within the circuitry for operating the row of memory cells, proximal to the row of memory cells. The intervention circuit is operated to retain the row of memory cells in a desired state, and the circuitry for operating the row of memory cells preceding the intervention circuit is powered down.

The present invention also provides a semiconductor device that comprises a row of memory cells. Control circuitry precedes the row of memory cells. An intervention circuit is instantiated within the control circuitry proximal to the row of memory cells. The intervention circuit is adapted to hold the row of memory cells at a desired state while the control circuitry preceding the intervention circuit is powered down.

The present invention further provides a wordline circuitry segment in an SRAM device. The circuitry segment comprises a first node coupled to a wordline enable signal, a second node coupled to a wordline signal, a third node coupled to a sleep mode assertion signal, a fourth node coupled to a first reference voltage, and a fifth node coupled to a second reference voltage. A first transistor structure has a first terminal coupled to the first node, a second terminal coupled to the fourth node, and a third and fourth terminal. A second transistor structure has a first terminal coupled to the fourth terminal of the first transistor structure, a second terminal coupled to the fourth node, a third terminal coupled to the third terminal of the first transistor structure, and a fourth terminal coupled to the second node. A third transistor structure has a first terminal coupled to the third node, a second terminal coupled to the third terminal of the first transistor structure, and a third terminal coupled to a third reference voltage. A fourth transistor structure has a first terminal coupled to the fifth node, a second terminal coupled to the fourth node, and a third terminal coupled to the second node.

The present invention further provides another embodiment of a wordline circuitry segment in an SRAM device. The circuitry segment comprises a first node coupled to a wordline enable signal, a second node coupled to a wordline signal, a third node coupled to a sleep mode assertion signal, a fourth node coupled to a first reference voltage, a fifth node coupled to a second reference voltage, and a sixth node coupled to a third reference voltage. A first transistor structure has a first terminal coupled to the first node, a second terminal, a third terminal coupled to the fifth node, and a fourth terminal. A second transistor structure has a first terminal coupled to the fourth terminal of the first transistor structure, a second terminal coupled to the fourth node, a third terminal coupled to the fifth node, and a fourth terminal coupled to the second node. A third transistor structure has a first terminal coupled to the third node, a second terminal coupled to a fourth reference voltage, and a third terminal coupled to the second terminal of the first transistor structure. A fourth transistor structure has a first terminal coupled to the sixth node, a second terminal coupled to the first terminal of the second transistor structure, and a third terminal coupled to the fifth node.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with SRAM memory architecture. The specific embodiments discussed herein are merely illustrative of specific ways to make and use the invention and do not limit the scope of the invention.

The present invention provides a versatile system that reduces SRAM power consumption during sleep mode. As previously noted, minimizing SRAM standby power during sleep mode is critical to many power sensitive applications, especially those that rely on low-voltage battery sources for power (e.g., wireless communications devices).

For an array during sleep mode, conventional systems often relied on raising ground voltage levels, with respect to supply voltage levels, in order to minimize or suppress bit cell leakage and related effects. A given wordline was held at the ground voltage level, the supply voltage level, or at some level therebetween, in order to minimize array leakage current and related effects. Conventional methods for powering down row-periphery circuitry during sleep mode often involved holding wordline control signals at predetermined logic levels, such that all wordlines were held at a specified voltage level. Unfortunately, this required that circuitry along the control paths to the wordlines remain active (i.e., powered up). Hence, row-periphery related leakage currents (including, e.g., direct gate tunneling leakage) resulted. This row-periphery leakage was significant, in comparison to the reduced array leakage levels. Even with aggressive design adaptations (e.g., longer gate length, n-well bias), the row-periphery leakage apparently could not be reduced significantly below the array leakage levels.

In contrast, the present invention provides a system for powering down row-periphery circuitry without negatively impacting the stability and reliability of data stored in a corresponding wordline. The present invention provides a system capable of reducing row-periphery leakage levels to or below array leakage levels. The present invention provides intervention, or keeper, circuitry instantiated on, or in immediate proximity to, a given wordline. The intervention circuitry maintains, or "keeps", a wordline at a voltage level at so either of, or between, a selected supply voltage level ($V_{SS}$) and a selected baseline array voltage level ($V_{SS\_Array}$). Once the wordline is kept at its desired level, the need for maintaining the voltage levels of any preceding row-periphery control circuitry is virtually eliminated. The present invention thus provides optimal power savings in sleep mode.

Figure 1A:
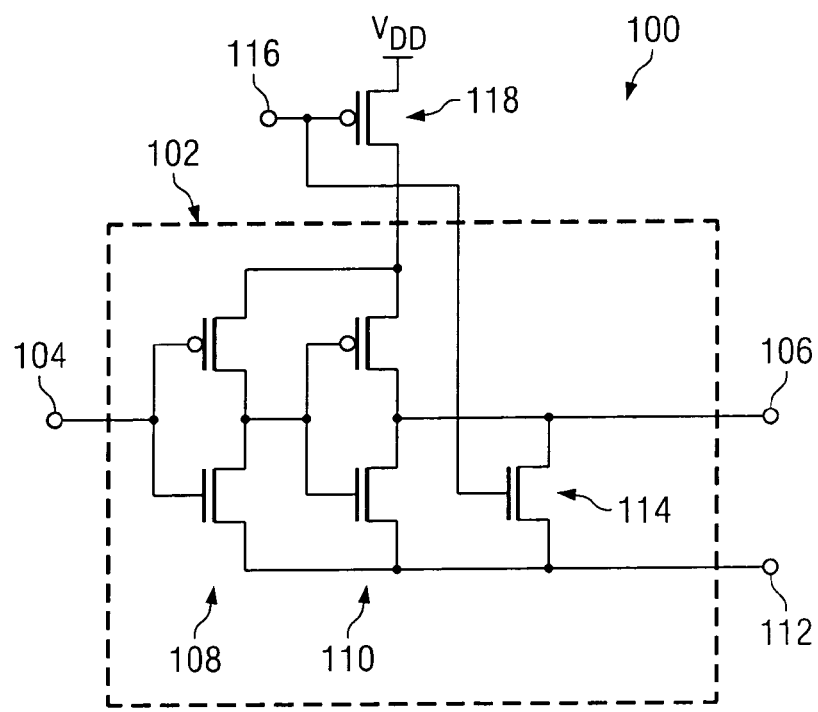
FIG. 1a is an illustration of one embodiment of memory circuitry according to the present invention.

Referring now to FIG. 1a, one embodiment of a row periphery circuitry segment 100, according to the present invention, is illustrated. Circuitry 100 comprises wordline control (or driver) circuitry 102, having an input node 104 and an output node 106. Input node 104 is coupled to a control signal source, providing a wordline enable (WLE)

signal. This control signal source may comprise the output of some row decode circuitry, or any other desired control signal source. Output node 106 couples to the actual wordline signal, associated with a corresponding row of memory or data storage cells. Control circuitry 102 comprises a pre-driver transistor pair 108 and a driver transistor pair 110. The low voltage terminals of structures 108 and 110 are coupled to a voltage node 112. Node 112 is coupled to a baseline array voltage ($V_{SS\_Array}$). Alternatively, node 112 may be connected to chip $V_{SS}$ (ground) directly, or through a footer transistor. If connected through a footer transistor, the footer transistor may be turned on for active mode and turned off for sleep mode. In one embodiment, ($V_{SS\_Array}$) is selected such that when circuitry 100 is powered down in accordance with the present invention, leakage current levels of the row-periphery circuitry are lower than array leakage current levels. Circuit 102 further comprises a keeper circuit 114, instantiated immediately "downstream" of driver pair 110 (i.e., between structure 110 and the actual wordline signal 106). In the embodiment depicted in FIG. 1a, keeper 114 is depicted as a transistor. In alternative embodiments, however, the keeper circuit 114 could be any circuit structure suitable for holding signal 106 at its desired level (e.g., a resistor). In FIG. 1a, the source of keeper 114 is coupled to node 112, and the drain of keeper 114 is coupled to node 106. The gate of keeper 114 is coupled to node 116, which provides a sleep mode control signal (SL). Node 116 also couples to the gate of transistor 118. In the embodiment of FIG. 1a, transistor 118 is power switch transistor, having its source coupled to a supply voltage ($V_{DD}$), and its drain coupled jointly to the high voltage terminals of structures 108 and 110.

It should be noted that references made to certain device structures will vary, depending upon the specific device processing technology utilized. For example, a transistor's terminals, referred to as source and drain for a PMOS technology, would, in an NMOS technology, be referred to as drain and source, respectively. Where transistor pairs or other transistor structures are utilized, reference to the input, output, high voltage and low voltage terminals may be most appropriate. All such variations are comprehended.

Operationally, circuitry 100 functions as follows. During active mode (i.e., non-sleep mode), (SL) is held low. Thus, keeper circuit 114 is dormant while the other wordline driver circuitry within circuit 102 operates normally. Data is transferred to and from an associated row as desired. Once the decision to enter sleep mode is made, (SL) is asserted (i.e., brought high). Keeper 114 is activated, holding the voltage at node 106 to the voltage level of node 112. Concurrently, structures 108 and 110 are shut down via power transistor 118. Because the activation of keeper 114 and powering down of pairs 108 and 110 are concurrently driven by the assertion of (SL), there is negligible delay between the actions. Essentially, activation of keeper 114 and power-down of pairs 108 and 110 is concurrent. The voltage levels of circuitry preceding keeper 114 are not maintained, substantially reducing power consumption and leakage currents previously associated with such wordline driver circuitry.

Figure 1B:
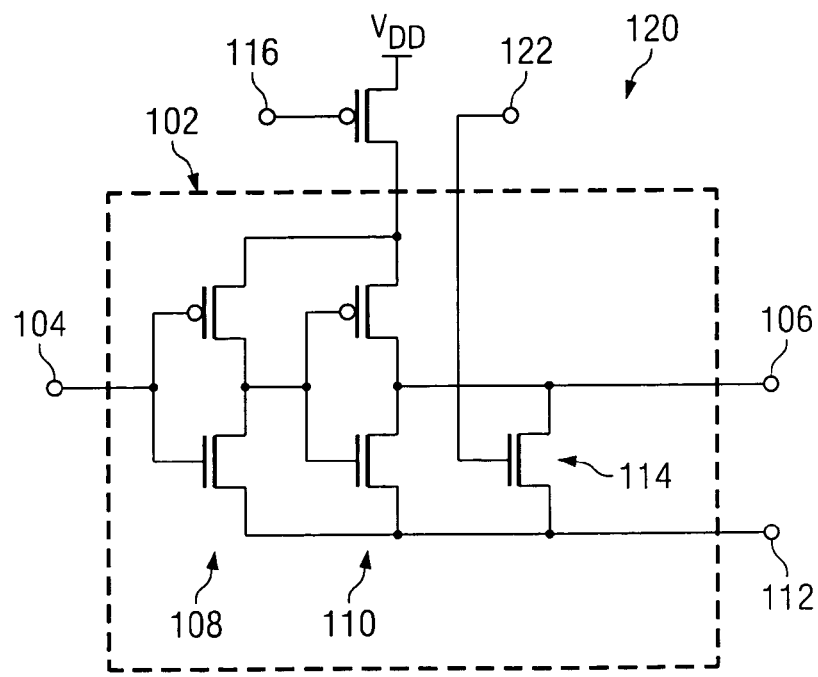
FIG. 1b is an illustration of another embodiment of memory circuitry according to the present invention.

FIG. 1b illustrates circuitry 120, which is one alternative embodiment of circuitry 100 from FIG. 1a. In circuitry 120, the activation of keeper circuitry 114 is signaled through a node 122 that is separate from node 116. Thus, in this embodiment, the gate of keeper 114 is coupled to node 122. Node 122 provides a sleep mode control signal (SLK) for the keeper 114 that is independent of, and not concurrent with, the sleep mode control signal (now SLD) applied to node 116 for the wordline driver circuitry. Operationally, in order to enter sleep mode, (SLK) is asserted before any wordline driver or row decode sleep mode signals (SLRD) are asserted. Coming out of sleep mode, (SLK) is powered down only after the preceding circuitry is reactivated. This ensures that the row content is protected and maintained throughout the sleep mode process.

Figure 2:
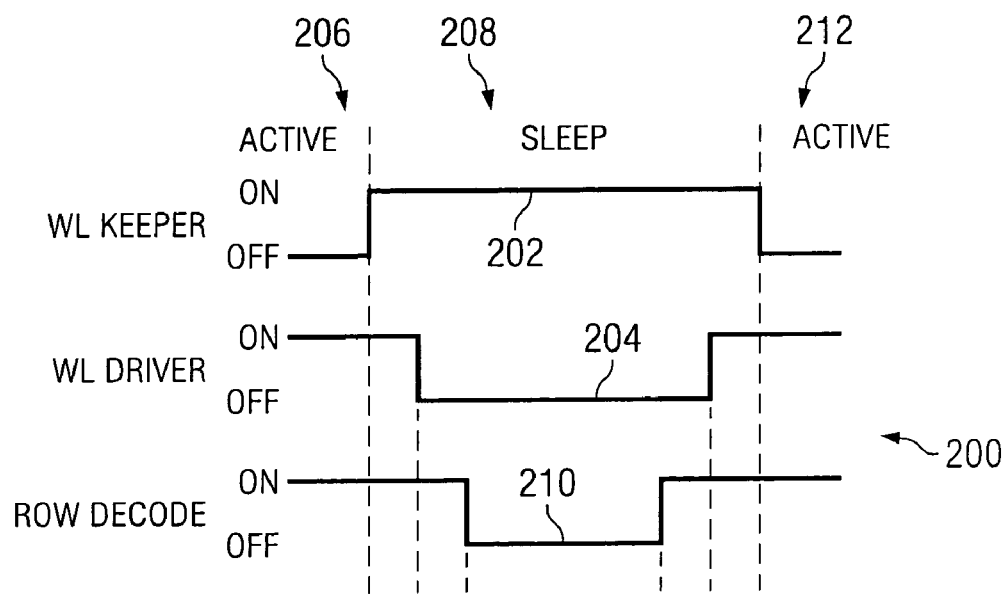
FIG. 2 is a diagram depicting one example of a timing scheme for operation of the circuitry illustrated in FIG. 1b in accordance with the present invention.

This is illustrated in the timing diagram of FIG. 2. FIG. 2 depicts one embodiment of a timing scheme 200 by which circuitry 120 may be operated. Within scheme 200, plot line 202 represents the logical operational state (i.e., on or off) of keeper 114, while plot lines 204 and 210 represent the power states (i.e., power on or off) of the preceding wordline driver circuitry (i.e., pairs 108 and 110), and the row decode circuitry, respectively. As circuit 120 is transitioned from an active mode 206 to a sleep mode 208, the wordline keeper 114 (WL Keeper) is turned on first. After a nominal delay that varies greatly depending upon the specific design technologies used (e.g., ~10 ns), the wordline driver circuitry (WL Driver) is powered down. Next, any related row-decode circuitry (Row Decode), the power state of which is represented by plot line 210, may be powered down after a similar delay. Upon transitioning from sleep mode 208 back into an active mode 212, the logical operation and power states of each segment 210, 204 and 202 are changed back in reverse order, with similar delays.

Figure 3:
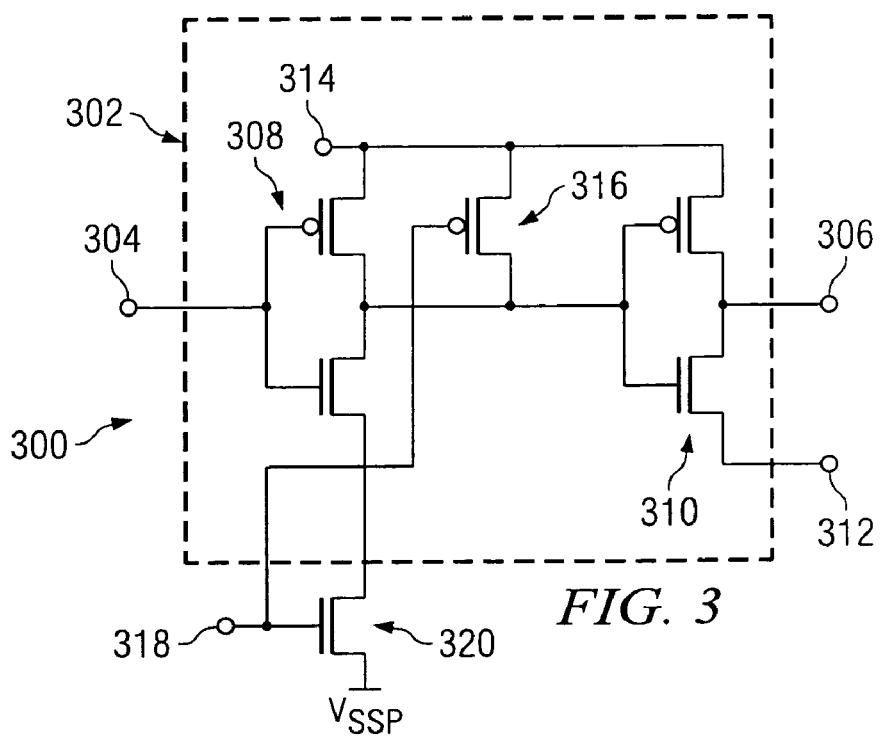
FIG. 3 is an illustration of another embodiment of memory circuitry according to the present invention.

Referring now to FIG. 3, another embodiment of a wordline circuitry segment 300, according to the present invention, is illustrated. Circuitry 300 comprises wordline driver circuitry 302, having an input node 304 and an output node 306. Input node 304 is coupled to a control signal source, providing a wordline enable (WLE) signal. This control signal source may comprise the output of some row decode circuitry, or any other desired control signal source. Output node 306 couples to the actual wordline signal, associated with a corresponding row of memory or data storage cells. Driver circuitry 302 comprises a pre-driver transistor pair 308 and a driver transistor pair 310. The low voltage terminal of structure 310 is coupled to a voltage node 312. Node 312 is coupled to baseline array voltage ($V_{SS\_Array}$). Alternatively, node 312 may be connected to chip $V_{SS}$ (ground) directly, or through a footer transistor. If connected through a footer transistor, the footer transistor may be turned on for active mode and turned off for sleep mode. The high voltage terminal of transistor structure 310 is coupled to a voltage node 314. Node 314 is coupled to supply voltage ($V_{DD}$). The high voltage terminal of transistor 308 is also coupled to node 314. The input terminal of transistor pair 308 is coupled to node 304. Circuit 302 further comprises a keeper circuit 316, instantiated between transistor structures 308 and 310. In the embodiment depicted in FIG. 3, keeper 316 is a transistor. In alternative embodiments, however, keeper circuit 316 could be any circuit structure suitable for holding a desired signal level in accordance with the present invention. In FIG. 3, the drain of keeper 316 is coupled to the input terminal of transistor structure 310 (and to the output terminal of transistor pair 308), and the source of keeper 316 is coupled to node 314. The gate of keeper 316 is coupled to node 318, which provides a sleep mode control signal (SL). Node 318 also couples to the gate of transistor 320. In the embodiment of FIG. 3, transistor 320 is power switch transistor, having its drain coupled to the low voltage terminal of transistor structure 308. The source of transistor 320 is coupled to a desired supply voltage ($V_{SSP}$) or, alternatively, to ground.

Operationally, circuitry 300 functions as follows. During active mode (i.e., non-sleep mode), (SL) is held high. Thus, keeper circuit 316 is dormant while the other wordline driver circuitry within circuit 302 operates normally. Data is transferred to and from an associated row as desired. Once the decision to enter sleep mode is made, (SL) is asserted (i.e., brought low). Keeper 316 is activated, keeping transistor structure 310 on and, as a result, holding the Voltage at node 306 to the voltage level at node 312. Concurrently, transistor 308 is shut down via power transistor 320. Thus, the voltage levels of circuitry preceding keeper 316 are not maintained.

Compared with the embodiments illustrated in FIGS. 1a and 1b, circuitry 300 has so less speed loss, and less layout area overhead, as a result of instantiating the intervention circuitry. Nonetheless, because of the relative placement of the keeper circuitry 316, circuitry 300 does have slightly higher leakage current levels during sleep mode. This is due primarily to the fact that keeper circuitry 316 keeps transistor structure 310 on and active during sleep mode. When compared with previous methods and systems, however, this embodiment still provides substantial power savings.

Figure 4:
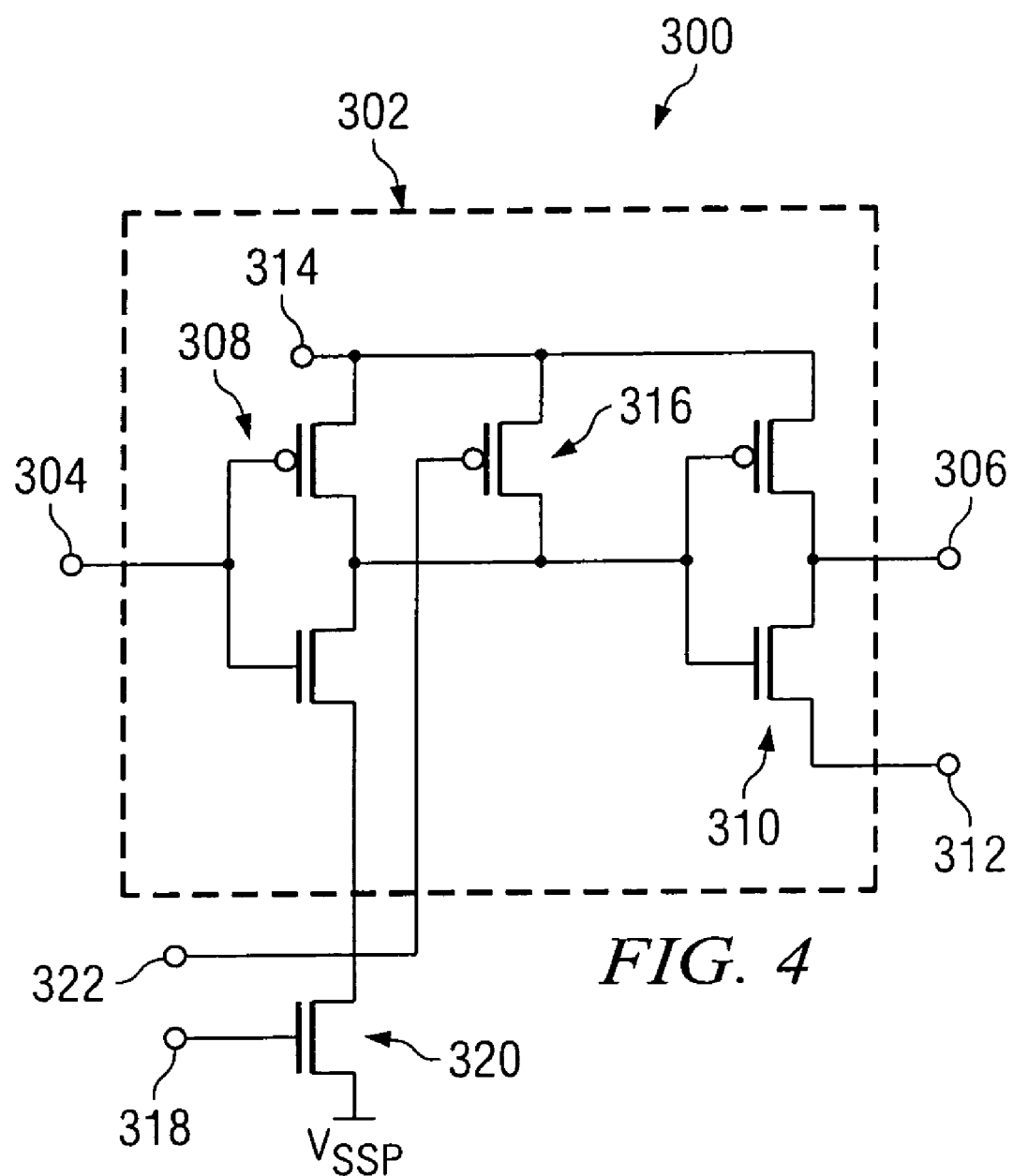
FIG. 4 is an illustration of another embodiment of memory circuitry according to the present invention.

In one alternative embodiment of circuitry 300, shown in FIG. 4, the activation of keeper circuitry 316 is signaled through a node 322 that is separate from node 318 —similar to circuit 120. In this embodiment, the gate of keeper 316 is coupled to a separate node 322 that provides a sleep mode control signal (SLK) for keeper 316. The sleep mode control signal is independent of, and not concurrent with, the sleep mode control signal applied to node 318 for the wordline driver circuitry.

Thus, utilizing the methods and apparatus of the present invention, memory devices are provided with row-periphery power down during a sleep mode. This results in significant reductions of device leakage currents and power consumption. Consider, for example, the substantial benefits of row-periphery shut down during sleep mode in a representative design having a 1 Meg retained memory. Without any row-periphery shut down during sleep mode, the peripheral current of such a device could range from about 40 to 100 µA. Using previous power reduction techniques (e.g., reduced voltages), sleep mode peripheral current of such a device might be reduced to the range of 6 to 20 µA; Utilizing the teachings of the present invention, however, row-periphery leakage currents during sleep mode are reduced to levels less than 1 µA. Substantial power savings, and improved device and design performance, result therefrom. The present invention provides these substantial benefits while requiring no modifications to fabrication processes, and adding minimal design overhead.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method of reducing power consumption in a semiconductor memory device having a row of memory cells and circuitry for operating the row of memory cells, the method comprising the steps of:
    providing an intervention circuit;
    instantiating the intervention circuit within the circuitry for operating the row of memory cells, proximal to the row of memory cells;
    operating the intervention circuit to retain the row of memory cells in a desired state; and
    powering down, with a power switch, the circuitry for operating the row of memory cells preceding the intervention circuit;
    wherein the intervention circuit is operated by a first signal source, separate from a second signal source that powers down the circuitry for operating the row of memory cells preceding the intervention circuit.

2. The method of claim 1, wherein the row of memory cells comprises a wordline and the circuitry for operating the row of memory cells comprises driver circuitry.

3. The method of claim 1, wherein the intervention circuit comprises a resistor.

4. The method of claim 1, wherein the intervention circuit comprises a transistor.

5. The method of claim 2, wherein the intervention circuit is instantiated such that a driver transistor pair of the driver circuitry is between the intervention circuit and the wordline.

6. The method of claim 2, wherein the intervention circuit is instantiated between the wordline and driver circuitry.

7. The method of claim 1, wherein the steps of operating the intervention circuit and powering down the circuitry for operating the row of memory cells preceding the intervention circuit are not performed concurrently.

8. The method of claim 1, wherein a nominal delay follows the step of operating the intervention circuit before powering down the circuitry for operating the row of memory cells preceding the intervention circuit is performed.

9. A semiconductor device comprising:
    a row of memory cells;
    control circuitry preceding the row of memory cells; and
    an intervention circuit, instantiated within the control circuitry proximal to the row of memory cells, adapted to hold the row of memory cells at a desired state while control circuitry preceding the intervention circuit is powered down with a power switch having a control signal input, wherein the power switch is not located within the control circuitry, wherein the intervention circuit comprises a resistor.

10. A semiconductor device comprising:
    a row of memory cells;
    control circuitry preceding the row of memory cells; and
    an intervention circuit, instantiated within the control circuitry proximal to the row of memory cells, adapted to hold the row of memory cells at a desired state while control circuitry preceding the intervention circuit is powered down with a power switch having a control signal input, wherein the power switch is not located within the control circuitry, wherein the row of memory cells comprises a wordline and the control circuitry preceding the row of memory cells comprises driver circuitry, and further, wherein the intervention circuit is coupled to a first assertion signal source, and a second assertion signal source is coupled to the driver circuitry.

11. The method of claim 1, wherein the circuitry for operating the row of memory cells preceding the intervention circuit comprises a wordline pre-driver circuit.

* * * * *